(12) United States Patent
Marsala

(10) Patent No.: US 6,519,955 B2
(45) Date of Patent: Feb. 18, 2003

(54) PUMPED LIQUID COOLING SYSTEM USING A PHASE CHANGE REFRIGERANT

(75) Inventor: Joseph Marsala, Manchester, MA (US)

(73) Assignee: Thermal Form & Function, Manchester, MA (US)

(*) Notice: Subject to any disclaimer, the term of this patent is extended or adjusted under 35 U.S.C. 154(b) by 0 days.

(21) Appl. No.: 09/819,591

(22) Filed: Mar. 28, 2001

(65) Prior Publication Data

US 2002/0007641 A1 Jan. 24, 2002

Related U.S. Application Data

(60) Provisional application No. 60/194,381, filed on Apr. 4, 2000.

(51) Int. Cl.[7] .............................................. F25D 15/00
(52) U.S. Cl. ........................ 62/119; 62/259.2; 165/80.4; 361/688
(58) Field of Search ............................ 62/119, 118, 114, 62/259.2; 361/676, 688, 715, 716; 165/80.2, 80.4, 80.5

(56) References Cited

U.S. PATENT DOCUMENTS

| 3,774,677 A | * 11/1973 | Antonetti et al. |
| 3,817,321 A | 6/1974 | von Cube et al. |
| 4,314,601 A | * 2/1982 | Giuffre et al. |
| 5,333,677 A | * 8/1994 | Molivadas |
| 5,406,807 A | * 4/1995 | Ashiwake et al. |
| 5,713,413 A | 2/1998 | Osakabe et al. |

* cited by examiner

Primary Examiner—Chen-Wen Jiang
(74) Attorney, Agent, or Firm—Barbara Joan Haushalter

(57) ABSTRACT

An improved cooling system provides cooling away from the surface of electrical and electronic components with very low parasitic power consumption and very high heat transfer rates. The component to be cooled is in thermal contact with a cold plate evaporator device. Refrigerant is circulated by a liquid refrigerant pump to the cold plate evaporator device, and the liquid refrigerant is at least partially evaporated by the heat generated by the component. The vapor is condensed by a conventional condenser coil and the condensed liquid along with any unevaporated liquid is returned to the pump. The system operates nearly isothermally in both evaporation and condensation.

7 Claims, 2 Drawing Sheets

PUMPED LIQUID COOLING SYSTEM USING A PHASE CHANGE REFRIGERANT

RELATED APPLICATIONS

This is a regularly filed application, based on U.S. provisional application Serial No. 60/194,381, filed Apr. 4, 2000.

TECHNICAL FIELD

The present invention relates to cooling of electrical and electronic components, and more particularly, to a liquid refrigerant pump to circulate refrigerant to multiple cold plate/evaporators in thermal contact with the electrical or electronic component to be cooled.

BACKGROUND OF THE INVENTION

Electrical and electronic components (e.g. microprocessors, IGBT's, power semiconductors etc.) are most often cooled by air-cooled heat sinks with extended surfaces, directly attached to the surface to be cooled. A fan or blower moves air across the heat sink fins, removing the heat generated by the component. With increasing power densities, miniaturization of components, and shrinking of packaging, it is sometimes not possible to adequately cool electrical and electronic components with heat sinks and forced air flows. When this occurs, other methods must be employed to remove heat from the components.

One method for removing heat from components when direct air-cooling is not possible uses a single-phase fluid which is pumped to a cold plate. The cold plate typically has a serpentine tube attached to a flat metal plate. The component to be cooled is thermally attached to the flat plate and a pumped single-phase fluid flowing through the tube removes the heat generated by the component.

There are many types of cold plate designs, some of which involve machined grooves instead of tubing to carry the fluid. However all cold plate designs operate similarly by using the sensible heating of the fluid to remove heat. The heated fluid then flows to a remotely located air-cooled coil where ambient air cools the fluid before it returns to the pump and begins the cycle again. This method of using the sensible heating of a fluid to remove heat from electrical and electronic components is limited by the thermal capacity of the single phase flowing fluid. For a given fluid to remove more heat, either its temperature must increase or more fluid must be pumped. This creates high temperatures and/or large flow rates to cool high power microelectronic devices. High temperatures may damage the electrical or electronic devices, while large flow rates require pumps with large motors which consume parasitic electrical power and limit the application of the cooling system. Large flow rates may also cause erosion of the metal in the cold plate due to high fluid velocities.

Another method for removing heat from components when air-cooling is not feasible uses heat pipes to transfer heat from the source to a location where it can be more easily dissipated. Heat pipes are sealed devices which use a condensable fluid to move heat from one location to another. Fluid transfer is accomplished by capillary pumping of the liquid phase using a wick structure. One end of the heat pipe (the evaporator) is located where the heat is generated in the component, and the other end (the condenser) is located where the heat is to be dissipated; often the condenser end is in contact with extended surfaces such as fins to help remove heat to the ambient air. This method of removing heat is limited by the ability of the wick structure to transport fluid to the evaporator. At high thermal fluxes, a condition known as "dry out" occurs where the wick structure cannot transport enough fluid to the evaporator and the temperature of the device will increase, perhaps causing damage to the device. Heat pipes are also sensitive to orientation with respect to gravity. That is, an evaporator which is oriented in an upward direction has less capacity for removing heat than one which is oriented downward, where the fluid transport is aided by gravity in addition to the capillary action of the wick structure. Finally, heat pipes cannot transport heat over long distances to remote dissipaters due once again to capillary pumping limitations.

Yet another method which is employed when direct air-cooling is not practical uses the well-known vapor compression refrigeration cycle. In this case, the cold plate is the evaporator of the cycle. A compressor raises the temperature and pressure of the vapor, leaving the evaporator to a level such that an air-cooled condenser can be used to condense the vapor to its liquid state and be fed back to the cold plate for further evaporation and cooling. This method has the advantage of high isothermal heat transfer rates and the ability to move heat considerable distances. However, this method suffers from some major disadvantages which limit its practical application in cooling electrical and electronic devices. First, there is the power consumption of the compressor. In high thermal load applications the electric power required by the compressor can be significant and exceed the available power for the application. Another problem concerns operation of the evaporator (cold plate) below ambient temperature. In this case, poorly insulated surfaces may be below the dew point of the ambient air, causing condensation of liquid water and creating the opportunity for short circuits and hazards to people. Vapor compression refrigeration cycles are designed so as not to return any liquid refrigerant to the compressor which may cause physical damage to the compressor and shorten its life by diluting its lubricating oil. In cooling electrical and electronic components, the thermal load can be highly variable, causing unevaporated refrigerant to exit the cold plate and enter the compressor. This can cause damage and shorten the life of the compressor. This is yet another disadvantage of vapor compression cooling of components.

It is seen then that there exists a continuing need for an improved method of removing heat from components when air-cooling is not feasible.

SUMMARY OF THE INVENTION

This need is met by the pumped liquid cooling system of the present invention wherein cooling is provided to electrical and electronic components with very low parasitic power consumption and very high heat transfer rates away from the component surface. This invention also reduces the temperature drop required to move heat from the component to the ambient sink.

In accordance with one aspect of the present invention, a liquid refrigerant pump circulates refrigerant to cold plate/evaporators which are in thermal contact with the electrical or electronic component to be cooled. The liquid refrigerant is then partially or completely evaporated by the heat generated by the component. The vapor is condensed by a conventional condenser coil, and the condensed liquid, along with any unevaporated liquid, is returned to the pump. The system of the present invention operates nearly isothermally in both evaporation and condensation.

Accordingly, it is an object of the present invention to provide cooling to electrical and electronic components. It is a further object of the present invention to provide such cooling to components with very low parasitic power consumption and very high heat transfer rates away from the component surface. It is yet another object of the present invention to reduce the temperature drop required to move heat from the component to the ambient sink.

Other objects and advantages of the invention will be apparent from the following description, the accompanying drawings and the appended claims.

DETAILED DESCRIPTION OF THE PREFERRED EMBODIMENTS

Figure 1:
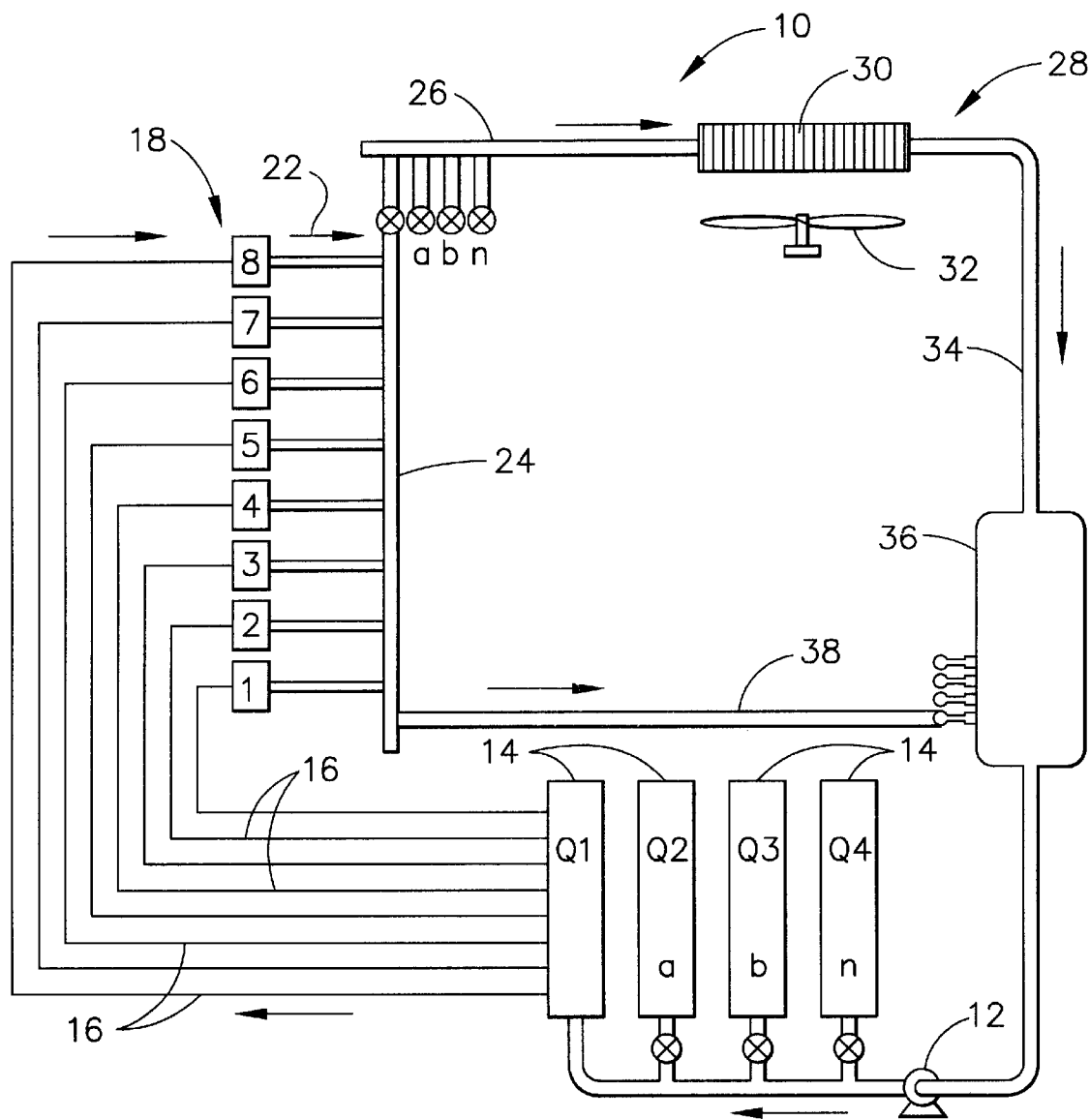
FIG. 1 is a schematic block diagram illustrating the pumped liquid cooling system in accordance with the present invention.

Referring now to FIG. 1, there is illustrated a cooling system 10 which circulates a refrigerant as the working fluid. The refrigerant may be any suitable vaporizable refrigerant, such as R-134a. The cooling cycle can begin at liquid pump 12, shown as a Hermetic Liquid Pump. Pump 12 pumps the liquid phase refrigerant to a liquid manifold 14, where it is distributed to a plurality of branches or lines 16. Additional liquid manifolds 14a, 14b and 14n are shown to indicate where more branches (or lines) could be attached. The actual number of branches will depend on the number of components to be cooled by the system.

From the manifold 14, each branch or line 16 feeds liquid refrigerant to a cold plate 18.

Figure 2:
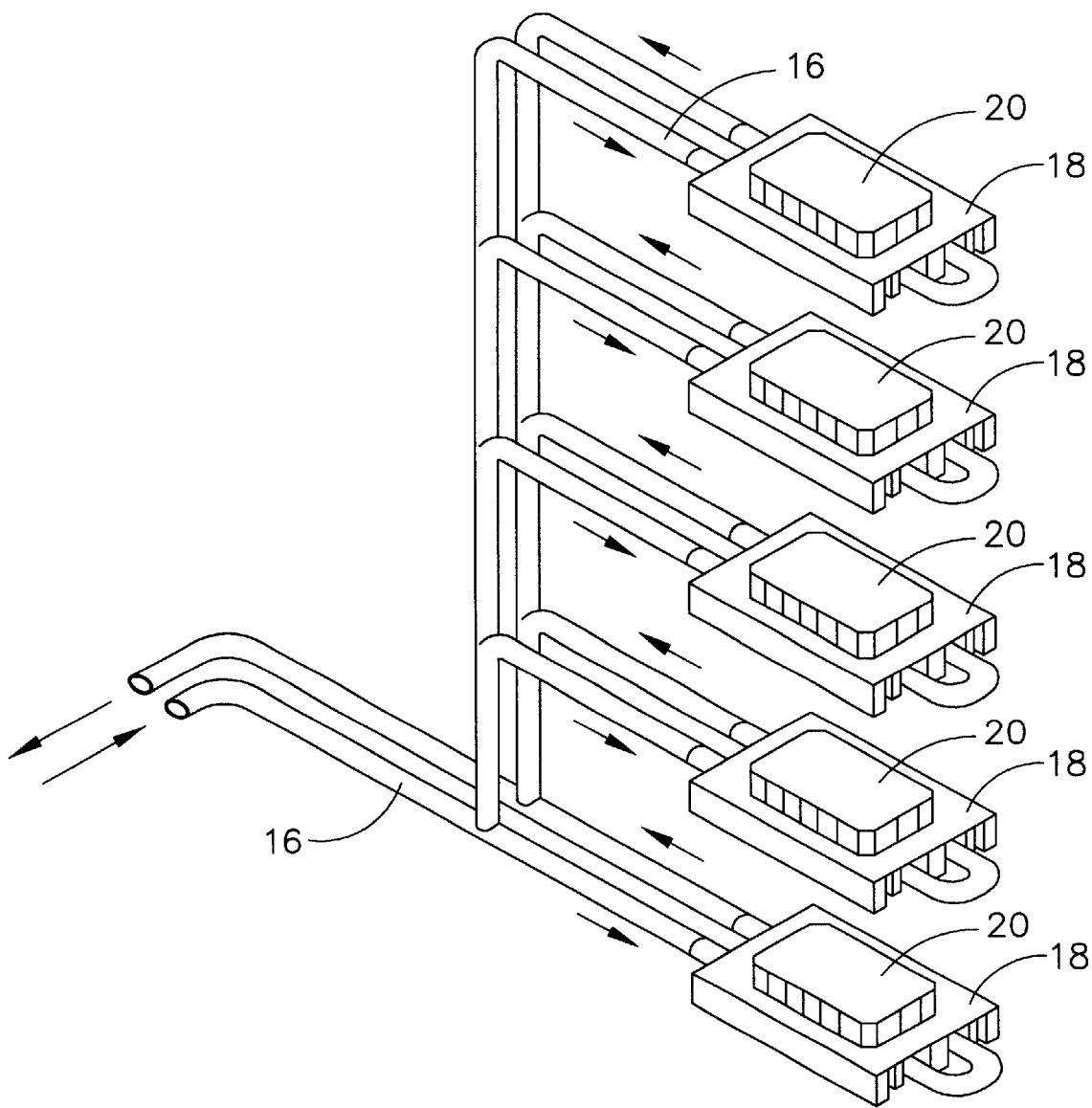
FIG. 2 illustrates a plurality of cold plate evaporator devices, each in thermal contact with a component to be cooled.

As illustrated in FIG. 2, each cold plate 18 is in thermal contact with an electrical or electronic component or components 20 to be cooled, causing the liquid refrigerant to evaporate at system pressure. None, some, or all of the liquid refrigerant may evaporate at cold plate 18, depending on how much heat is being generated by component 20. In most cases, some of the refrigerant will have evaporated and a two-phase mixture of liquid and vapor refrigerant will leave each cold plate 18, as shown by arrow 22.

In a preferred embodiment of the present invention, at this point in the operation of the system, each cold plate 18 discharges its mixture of two-phase refrigerant to vapor/liquid separator 24, as illustrated in FIG. 1. For most applications, the vapor/liquid separator 24 is a vertical tube of sufficient diameter to allow the heavier liquid refrigerant to fall to the bottom of the tube by gravity, while the lighter vapor rises to the top of the tube. In this manner, any unevaporated refrigerant is separated from the vapor and each phase may be treated separately within the system.

The vapor/liquid separator 24 is attached to a vapor line 26 leading to condenser 28, comprised of a condensing coil 30 and a fan 32. Additional vapor/liquid separators 24a, 24b, and 24n, may be connected through the use of vapor manifolds so that the cooling capacity of the system may be increased. Condenser coil 30, attached to vapor line 26, condenses the vapor phase back to a liquid and removes the heat generated by the electronic components 20. In FIG. 1, an ambient air-cooled condenser 28 is shown, using fan 32, although it will occur to those skilled in the art that any suitable form of heat rejection may be used without departing from the scope of the invention, such as an air cooled condenser, a water or liquid cooled condenser, or an evaporative condenser.

The condenser 28 operates at a pressure which corresponds to a temperature somewhat higher than the temperature of the ambient air. In this way, it is impossible for condensation to form, since no system temperature will be below the ambient dew point temperature. The condenser operating point sets the pressure of the entire system by means of the entering coolant temperature and its ability to remove heat from the condenser, thus fixing the condensing temperature and pressure. Also, since vaporized refrigerant is being condensed to a liquid phase, the condenser 28 sets up a flow of vaporized refrigerant from the vapor/liquid separator 24 into the condenser 28, without the need for any compressor to move the vapor from the cold plate-evaporator 18 to the condenser 28. The liquid refrigerant exits the condenser 28, as indicated by arrow 34, and moves by gravity to a liquid receiver 36, which holds a quantity of liquid refrigerant.

In one embodiment of the invention, connected to the liquid receiver 36 is a second and optional liquid return line 38 from the vapor/liquid separator 24. Alternatively, all liquid can be returned to the pump 12 via line 26, passing through the condenser 28 to change vapor back to liquid. With the addition of liquid return line 38, there are two sources of liquid refrigerant. One source of liquid refrigerant is from the condenser and the other is from the separator. Either line 26, or line 38, or both, can be used to carry any unevaporated liquid refrigerant from the separator 24 to the liquid receiver 36, where it may be used again in the cycle. The liquid receiver, therefore, can receive liquid from the condenser or from the separator. The quantity of liquid refrigerant held in the liquid receiver 36 provides a liquid head over the inlet of the pump 12 so the pump operates reliably. The liquid receiver 36 also handles changes in the amount of liquid refrigerant in the system 10 by providing a reservoir to store refrigerant. The outlet of the liquid receiver is connected to the inlet of the liquid refrigerant pump 12. At the pump 12, the pressure of the refrigerant is raised sufficiently to overcome the frictional losses in the system and the cooling cycle begins again. The pump 12 is selected so that its pressure rise is equal to or exceeds the frictional loss in the system at the design flow rate.

Unlike the pumped liquid single-phase system, the present invention operates isothermally, since it uses change of phase to remove heat rather than the sensible heat capacity of a liquid coolant. This allows for cooler temperatures at the evaporator and cooler components than a single-phase liquid system. Low liquid flow rates are achieved through the evaporation of the working fluid to remove heat, keeping the fluid velocities low and the pumping power very low for the heat removed. Parasitic electric power is reduced over both the pumped single-phase liquid system and the vapor compression refrigeration system.

An advantage over the heat pipe system is obtained with the system 10 of the present invention because the liquid flow rate does not depend on capillary action, as in a heat pipe, and can be set independently by setting the flow rate of the liquid pump. Dry out can thus be avoided. The cold plate/evaporator system of the present invention is insensitive to orientation with respect to gravity. Unlike heat pipe systems, the thermal capacity of the evaporator 18 of the present invention does not diminish in certain orientations.

Another advantage of the present invention over heat pipe and vapor compression based systems is the ability to separate the evaporator and condenser over greater distances. This allows more flexibility in packaging systems and design arrangements. In accordance with the present invention, liquid and vapor are transported independently, allowing for optimization of liquid and vapor line sizes. The present invention easily handles variation in thermal load of the components 20 to be cooled. Since any unevaporated liquid refrigerant is returned to the pump, multiple cold plates at varying loads are easily accommodated without fear of damaging a compressor. Since the current invention does not operate at any point in the system 10 at temperatures below ambient dew point temperature, there is no possibility of causing water vapor condensation and the formation of liquid water.

Having described the invention in detail and by reference to the preferred embodiment thereof, it will be apparent that other modifications and variations are possible without departing from the scope of the invention defined in the appended claims.

What is claimed is:

1. A method for cooling one or more electrical or electronic components generating heat and required to be cooled, the method comprising the steps of:

locating at least one cold plate evaporator device in thermal contact with the one or more electrical or electronic components;

providing a liquid refrigerant pump;

providing a refrigerant;

providing a liquid receiver for, receiving the liquid refrigerant;

returning the liquid refrigerant to the liquid refrigerant pump;

using the liquid refrigerant pump to circulate refrigerant to the at least one cold plate evaporator device, whereby the refrigerant is at least partially evaporated by the heat generated by the one or more electrical or electronic components, creating a vapor;

using a condenser to condense the vapor to create a condensed liquid;

providing an unevaporated liquid return line; and providing a liquid return line from the condenser.

2. A method as claimed in claim 1 further comprising the step of providing a separator means for separating the unevaporated liquid refrigerant from the vapor.

3. A method as claimed in claim 1 wherein the liquid receiver receives unevaporated liquid from the unevaporated liquid return line and receives condensed liquid from the condenser liquid return line.

4. A method as claimed in claim 1 further comprising the step of providing at least one liquid manifold for receiving the refrigerant from the liquid refrigerant pump.

5. A method as claimed in claim 1 wherein the step of condensing the vapor further comprises the step of providing an air cooled condenser.

6. A method as claimed in claim 1 wherein the step of condensing the vapor further comprises the step of providing a liquid cooled condenser.

7. A method as claimed in claim 1 wherein the step of condensing the vapor further comprises the step of providing an evaporative condenser.

* * * * *